United States Patent [19]

Dearnaley et al.

[11] Patent Number: 6,153,327
[45] Date of Patent: Nov. 28, 2000

[54] AMORPHOUS CARBON COMPRISING A CATALYST

[75] Inventors: Geoffrey Dearnaley; James H. Arps, both of San Antonio, Tex.

[73] Assignee: Southwest Research Institute, San Antonio, Tex.

[21] Appl. No.: 09/135,257

[22] Filed: Aug. 17, 1998

Related U.S. Application Data

[63] Continuation-in-part of application No. 08/674,671, Jul. 2, 1996, Pat. No. 5,795,672, which is a continuation of application No. 08/398,281, Mar. 3, 1995, Pat. No. 5,624,718, which is a continuation-in-part of application No. 08/927,739, Sep. 11, 1997, which is a continuation-in-part of application No. 08/398,281, Mar. 3, 1995, Pat. No. 5,624,718.

[51] Int. Cl.$^7$ ............................................. H01M 4/86
[52] U.S. Cl. ........................... 429/40; 429/42; 429/44; 204/294
[58] Field of Search ................ 429/40, 41, 42, 429/44; 204/291, 294

[56] References Cited

U.S. PATENT DOCUMENTS

| | | | |
|---|---|---|---|
| 3,291,753 | 12/1966 | Thompson | 252/447 |
| 3,413,152 | 11/1968 | Folkins et al. | 136/86 |
| 3,423,247 | 1/1969 | Darland, Jr. et al. | 136/120 |
| 4,460,660 | 7/1984 | Kujas | 429/40 |
| 4,526,774 | 7/1985 | Maas, Jr. et al. . | |
| 4,551,220 | 11/1985 | Oda et al. | 204/294 |
| 4,795,656 | 1/1989 | Mizoguchi et al. | 427/38 |
| 4,876,115 | 10/1989 | Raistrick | 427/115 |
| 4,931,152 | 6/1990 | Naik et al. | 204/38.5 |
| 5,068,126 | 11/1991 | Suzuki et al. | 427/122 |
| 5,084,144 | 1/1992 | Reddy et al. . | |
| 5,151,334 | 9/1992 | Fushimi et al. | 429/32 |
| 5,192,523 | 3/1993 | Wu et al. | 427/523 |
| 5,284,571 | 2/1994 | Verbrugge | 205/118 |
| 5,296,274 | 3/1994 | Movchan et al. | 427/566 |
| 5,316,871 | 5/1994 | Swathirajan et al. | 429/33 |
| 5,336,570 | 8/1994 | Dodge, Jr. | 429/31 |
| 5,458,989 | 10/1995 | Dodge | 429/31 |
| 5,512,330 | 4/1996 | Dearnaley | 427/525 |
| 5,518,831 | 5/1996 | Tou et al. | 429/42 |
| 5,593,719 | 1/1997 | Dearnaley et al. | 427/2.26 |
| 5,605,714 | 2/1997 | Dearnaley et al. | 427/2.24 |
| 5,624,718 | 4/1997 | Dearnaley | 427/530 |
| 5,635,041 | 6/1997 | Bahar et al. | 204/282 |
| 5,725,573 | 3/1998 | Dearnaley et al. | 623/2 |
| 5,731,045 | 3/1998 | Dearnaley et al. | 427/527 |
| 5,750,013 | 5/1998 | Lin | 204/192.14 |
| 5,795,672 | 8/1998 | Dearnaley et al. . | |
| 5,879,827 | 3/1999 | Debe et al. | 429/40 |
| 5,879,828 | 3/1999 | Debe et al. | 429/41 |

FOREIGN PATENT DOCUMENTS 0 860 888 A1  8/1998  European Pat. Off. .

OTHER PUBLICATIONS

Mukerjee, et al., Effect of Sputtered Film of Platinum on Low Platinum Loading Electrodes on Electrode Kinetics of Oxygen Reduction in Proton Exchange Membrane Fuel Cells, Electrochimica Acta, vol. 38, No. 12, pp1661–1669, 1993.

Taylor et al., Preparation of High–Platinum–Utilization Gas Diffusion Electrodes for Proton–Exchange–Membrane Fuel Cells, J. Electrochemical Society, vol. 139, No. 5, May 1992.

Masayuki Morita, et al., Anodic Oxidation of Methanol at a Gold–Modified Platinum Electrocatalyst Prepared by RF Sputtering on a Glassy Carbon Support, Electrochimica Acta., vol. 36. No. 5/6, pp. 947–951, 1991.

Nobuyoshi Nakagawa, et al., Electrode Reaction at Fixed Platinum Film—Fixation of Platinum Film on Stabilized–Zirconia Electrolyte and its Effect on the Electrode Performance of the Solid–Electrolyte Fuel Cell—, Journal of Chemical Engineering of Japan, vol. 25, No. 1, 1992.

P. K. Srivastava, et al., Electrode supported solid oxide fuel cells: Electrolyte films prepared by DC magnetron sputtering, Solid State Ionics 99, pp. 311–319, 1997.

Shinichi Hirano, et al., High performance proton exchange membrane fuel cells with sputter–deposited Pt layer electrodes, Electrochimica Acta. vol. 42, No. 10, pp. 1587–1593, 1997.

Gerhard K. Wolk, et al., Ion Implanted Catalysts for Fuel Cell Reactions, Nuclear Instrucments and Methods 209/210, pp. 835–840, 1983.

Michael F. Weber, et al., Sputtered Fuel Cell Electrodes, J. Electrochemical Society: Electrochemical Science and Technology, vol. 134, No. 6, pp. 1416–1419, Jun. 1987.

Browne, Malcom W., "Diamond Coating May be Future of Tool Manufacture," Article in San Antonio Express News (Apr. 1, 1996).

*Primary Examiner*—Maria Nuzzolillo
*Assistant Examiner*—Raymond Alejandro
*Attorney, Agent, or Firm*—Paula D. Morris & Associates, P.C.

[57] ABSTRACT

Amorphous carbon comprising a dispersion comprising a catalytically effective load of catalyst, preferably an electrocatalytically effective load of a noble metal electrocatalyst, and membrane electrode assemblies and fuel cell electrodes incorporating same.

7 Claims, No Drawings

AMORPHOUS CARBON COMPRISING A CATALYST

This application is a continuation-in-part of U.S. patent application Ser. No. 08/674,671, filed Jul. 2, 1996, issued as U.S. Pat. No. 5,795,672, which is a continuation of U.S. patent application Ser. No. 08/398,281, filed Mar. 3, 1995, issued as U.S. Pat. No. 5,624,718. This application also is a continuation-in-part of U.S. patent application Ser. No. 08/927,739, filed Sep. 11, 1997 (pending), which is a continuation-in-part of U.S. patent application Ser. No. 08/398,281, filed Mar. 3, 1995, issued as U.S. Pat. No. 5,624,718.

FIELD OF THE INVENTION

The invention provides a catalytic coating comprising amorphous carbon, preferably an electrocatalytic coating for use in a fuel cell membrane electrode assembly.

BACKGROUND OF THE INVENTION

A fuel cell is an electrochemical device in which electrical energy is generated by chemical reaction without altering the basic components of the fuel cell—that is, the electrodes and the electrolyte. Fuel cells combine hydrogen and oxygen without combustion to form water and to produce direct current electric power. The process can be described as electrolysis in reverse. The fuel cell is unique in that it converts chemical energy continuously into electrical energy without an intermediate conversion to heat energy.

Fuel cells have been pursued as a source of power for transportation because of their high energy efficiency (unmatched by heat engine cycles), their potential for fuel flexibility, and their extremely low emissions. Fuel cells have potential for stationary and vehicular power applications, however, the commercial viability of fuel cells for power generation in stationary and transportation applications depends upon solving a number of manufacturing, cost, and durability problems.

The operation of a fuel cell involves supplying fuel to an anode, where the fuel is ionized to free electrons and hydrogen ions. The freed electrons flow through an external circuit to the cathode. The freed hydrogen ions pass through the electrolyte to the cathode, which is supplied with oxygen. The oxygen at the cathode is ionized by the electrons, which flow into the cathode from the external circuit connected to the anode. The ionized oxygen and hydrogen ions react to form water.

Fuel cells are broadly classified by operating temperature level, type of electrolyte, and type of fuel. Low-temperature fuel cells (less than 150° C./302° F.) require a catalyst in order to increase the rate of reaction to a level that is high enough for practical use. Electrodes for low temperature fuel cells usually are porous and impregnated with the catalyst.

Low temperature fuel cells cannot be used successfully for vehicular propulsion unless the fuel cells have a very large electrode area coated with catalytically active material. The noble metal catalysts used in low temperature fuel cells generally perform most efficiently if they are in small clusters of nanometric dimensions on a suitable support. The support material must be: (a) electrically conducting; (b) chemically inert in the fuel cell environment; (c) mechanically robust; (d) sufficiently adherent to the cell membrane; and, (e) depositable in a thin film form, into which platinum, or other catalyst material, can be incorporated.

A favored material for use as an electrode support material is carbon. The carbon typically is "doped" with 1–10% platinum or platinum-ruthenium. In the past, the catalyst-doped carbon has been applied in the form of ink or using complex chemical processes that require high temperature firing, resulting in a glassy carbon that contains platinum oxide. The high temperature firing that is used to produce these electrodes cannot be used to coat the ionomer membranes that are favored for use in polymer electrolyte fuel cells (PEFC's).

Some of the most efficient electrocatalysts for low temperature fuel cells are noble metals, such as platinum, which are very expensive. Some have estimated that the total cost of such catalysts is approximately 80% of the total cost of manufacturing a low-temperature fuel cell. The expense of such catalysts makes it imperative to reduce the amount, or loading, of catalyst required for the fuel cell. This requires an efficient method for applying the catalyst. The method also must produce an electrocatalytic coating with a minimal catalyst load which also has sufficient catalytic activity for commercial viability.

SUMMARY OF THE INVENTION

The present invention provides a composition comprising amorphous carbon comprising a dispersion comprising a catalytically effective load of a catalyst.

DETAILED DESCRIPTION OF THE INVENTION

The present invention applies known procedures for forming "diamond-like carbon" ("DLC") or "amorphous" carbon coatings to the formation of catalytic coatings, preferably electrocatalytic coatings for fuel cell electrodes.

As used herein, the term "diamond-like" carbon or "amorphous" carbon refers to a material composed of a mixture of "$sp^2$" and "$sp^3$" bonded carbon. "$Sp^2$" bonded carbon refers to double bonded carbon commonly associated with graphite. "$Sp^3$" bonded carbon refers to single bonded carbon commonly associated with diamond. Unlike diamond, amorphous or "diamond-like" carbon does not possess a highly ordered crystalline structure. Amorphous carbon generally takes the form of small nanometer sized (or larger) islands of graphite dispersed within an amorphous matrix of $sp^3$ bonded carbon.

Depending upon the method of deposition, the amorphous carbon may be essentially 100% carbon or may have a sizeable amount (up to 50 atomic %) of C—H bonded hydrogen. The term "diamond-like" often is used to describe the bulk mechanical properties of the amorphous carbon, specifically its hardness (anywhere from 10–40% of the hardness of crystalline diamond) and its low coefficient of friction under dry sliding conditions (frequently <0.1). "Diamond-like" or "amorphous" carbon does not necessarily have electrochemical properties that are similar to diamond. Amorphous carbon also does not usually exist in bulk form, but is deposited as a coating by such methods as ion beam assisted deposition, direct ion beam deposition, magnetron sputtering, ion sputtering, chemical vapor deposition, plasma enhanced chemical vapor deposition, cathodic arc deposition, and pulsed laser deposition.

Amorphous carbon is a suitable carrier for a number of catalysts. As used herein, the term "catalyst" is defined as a substance that increases the rate of approach to equilibrium of a chemical reaction without being substantially consumed in the reaction. A catalyst works by forming chemical bonds to one or more reactants and thereby facilitating their conversion. A catalyst does not affect the reaction equilibrium. A catalyst provides for alternate reaction pathways/ mechanisms that offer an overall lower activation energy for the reaction, thus accelerating the rate of turnover.

In electrochemical systems the reaction rate (power density/current density) is controlled by controlling temperature and electrocatalysis. Electrocatalysts are substances (metals, metal oxides, non-metals, organometallics, etc.) that can promote the rate of electrochemical reactions, i.e., ionization, deionization, for a given surface area. The electrocatalyst is a substance that accelerates the rate of forward and backward charge transfer reactions for a given redox system (charge transfer reaction) without perturbing chemical equilibrium (thermodynamics is not affected by the presence of a catalyst). An electrocatalyst provides for alternative reaction pathways/mechanisms that offer an overall lower activation energy for the electrochemical reaction, thus accelerating the rate of electrochemical turnover. The rate at which a reaction at an electrode surface proceeds may be limited by the intrinsic kinetics of the heterogeneous process. In non-electrochemical systems, the macroscopically observed reaction rate is the result of a series of elementary processes.

A key difference between an electrocatalyst and other types of catalysts is the ability of the electrocatalyst to manipulate an additional driving force variable: the electric potential. A change in potential of one volt at the surface of the electrocatalyst/electrode can cause a change in reaction rate of eight orders of magnitude. This change may be equivalent to an increase in temperature of several hundred degrees Celsius for a typical catalytic reaction. (i.e., non-electrochemical reaction). For fuel cell applications heterogeneous electrocatalysts exist as foils, deposited films, individual particles or supported particles. The word "heterogeneous" means that the reactant is normally in a different phase (gas or liquid) than the electrocatalyst (solid).

To describe how a particular surface electrocatalyzes/catalyzes a particular reaction requires a knowledge of three factors: the mechanism of the reaction pathway; the chemisorption energy of the surface species; and, the effective activation energy (energies) of the reaction. Metals with empty "d" orbitals are suitable electrocatalysts because they adsorb $H_2$ rapidly, with low activation energies of adsorption. Referring to the Periodic Table of the Elements, suitable electrocatalysts include, but are not necessarily limited to: Group IVA metals (Ti, Zr, Hf); Group VA metals (V, Nb, Ta), Group VIA metals (Cr, Mo, W); and, Group VIIA metals (Mn, Tc, Re). These metals appear to adsorb $H_2$ with high enthalpy of adsorption. Preferred electrocatalysts are metals which adsorb $H_2$ with lower heats, including but not necessarily limited to Groups VIIIA, B, and C (Fe, Ru, Os, Co, Rh, Ir; Ni, Pd, Pt), preferably Ni, Pd, or Pt, most preferably Pt. The group IB metals (Cu, Ag, Au) have low heats of adsorption, but are not preferred as $H_2$ adsorption catalysts because they have slow activated chemisorption.

The Group VIII metals, preferred electrocatalysts for use in fuel cell electrodes, are believed to have heats of adsorption in a range which enables the reactant to chemisorb strongly enough to allow for surface reaction (electrochemical oxidation/reduction by breakdown and discharge of adsorbed species) but not strongly enough to form surface-bonded species. Due to the greater activation energy of chemisorption for oxygen, electrocatalytic reactions which involve surface oxygen require higher temperatures in order to produce satisfactory reaction rates than do reactions which involve surface hydrogen. For example, the most widely used oxygen electrodes for low temperatures are silver and platinum. Summarizing, suitable catalysts for electrochemical applications include, but are not necessarily limited to Pt, Pd, Ru, Rh, Ir, Ag, Au, Os, Re, Cu, Ni, Fe, Cr, Mo, Co, W, Mn, Al, Zn, Sn, with preferred catalysts being Ni, Pd, Pt, most preferably Pt.

The coating of the invention may comprise primarily amorphous carbon with the catalyst dispersed therein, or the coating may comprise primarily the catalyst with amorphous carbon dispersed therein. The coating also may comprise a uniform dispersion of catalyst in amorphous carbon or amorphous carbon in catalyst, or the concentration of materials may be controlled during deposition to form a desired gradient. For example, where the substrate is a polymer electrolyte membrane (PEM) support for a fuel cell electrode, it may be more desirable to have a higher concentration of catalyst directly adjacent to the PEM, where higher catalyst activity levels are desirable.

The support for the claimed coating may be any number of materials, preferred materials being those suitable for use as electrodes in fuel cells. Suitable materials include, but are not necessarily limited to PEM materials, carbon cloth, and carbon paper. Preferred substrate materials are carbon cloth and PEM materials, preferably a fluoroionomer PEM material, most preferably a GORE SELECT™ membrane, available from W. L. Gore & Associates.

The coating of the present invention is formed by condensing a flux of vaporized carbon precursor and vaporized catalyst onto a desired substrate, and bombarding the condensate with an energetic beam of ions. This form of deposition—known as ion beam-assisted deposition, or "IBAD"—results in an amorphous carbon coating with a low level of residual hydrocarbon. As a result, the amorphous carbon coating has a relatively high electrical conductivity of about 10–100 mScm$^{-1}$ (milli Siemens per cm). Due to this relatively high conductivity, the amorphous carbon formed using IBAD is sufficiently conductive to transmit the electrical output of a fuel cell.

In order to form a single fuel cell electrode according to the present invention, a suitable substrate for electrocatalytic coating is provided, preferably a GORE SELECT™ membrane, available from W. L. Gore & Associates. The carbon precursor/catalyst flux is directed onto the membrane in a number of ways. Preferably, the membrane is placed in a vacuum chamber that is provided with: (a) two reservoirs—one for vaporizing a carbon precursor and one for vaporizing a catalyst; (b) a nozzle or other apparatus for directing and condensing the carbon precursor/catalyst flux onto the membrane; and, (c) an ion gun or other apparatus for directing an ion beam onto the condensed flux.

The amorphous carbon that is formed may be substantially pure, or hydrogen may be bonded to at least a portion of the carbon atoms in the amorphous carbon. Where substantially pure amorphous carbon is desired, a substantially pure carbon precursor is preferred. Substantially pure carbon precursors include, but are not necessarily limited to graphite, pyrolytic or "glassy" carbon, or fillerene. Where it is acceptable for the amorphous carbon to contain hydrogen, suitable carbon precursors include, but are not necessarily limited to diffusion pump materials which have a low vapor pressure and can be vaporized stably at room temperature. Examples of suitable diffusion pump fluids include, but are not necessarily limited to: polyphenyl ether; elcosyl naphthalene; i-diamyl phthalate; i-diamyl sebacate; chlorinated hydrocarbons; n-dibutyl phthalate; n-dibutyl sebacate; 2-ethyl hexyl sebacate; 2-ethyl hexyl phthalate; di-2-ethyl-hexyl sebacate; tri-m-cresyl phosphate; tri-p-cresyl phosphate; dibenzyl sebacate. Other suitable carbon precursors are the vacuum-distilled hydrocarbon mineral oils manufactured by Shell Oil Company under the trademark APIEZON. Of this group, APIEZON A, APIEZON B, APIEZON C, and APIEZON D are the most appropriate. Preferred diffusion pump fluids include polyphenyl ether and elcosyl napthalene.

Some of the process variables that may impact the composition and electrocatalytic effectiveness of the coating include the ratio of ion flux to Pt evaporation flux, coating thickness, Pt loading, and hydrogen concentration. In a preferred embodiment, the precursor reservoir is supplied with electrical resistance heating and the catalyst reservoir is adapted for thermal vaporization of the catalyst using electron beam heating. Alternately, the catalyst reservoir, like the precursor reservoir, may be supplied with electrical resistance heating. The composition of the electrocatalyst coating can be controlled by controlling the respective temperatures of the carbon precursor and catalyst vapor sources.

The catalyst may be uniformly dispersed in the amorphous carbon or may be graded throughout the coating. Where the catalyst is uniformly dispersed in the amorphous carbon, the catalyst may be dispersed at a load in the range of from about 0.001 to about 0.1 mg/cm$^2$, preferably about 0.01 mg/cm$^2$. In order to accomplish this dispersion, the ratio of atoms in the vapor being deposited is in the range of from about 8:1 to 1:3, carbon:catalyst. The ratio of carbon to catalyst can be quantified by Sputter Auger Electron Spectroscopy, and the resulting data can be used to determine the preferred vaporization conditions. In order to vaporize the carbon precursor, the carbon precursor reservoir is heated to between about 150° C.–170° C. (302° F.–338° F.), and the catalyst reservoir is heated to between about 2300° C.–2600° C. (4172° F.–4712° F.).

The substrate preferably is placed in the vacuum chamber, and the pressure in the vacuum chamber is pumped down to about 10$^{-4}$ torr or less. As used herein, the term "in a vacuum" is defined to mean at a pressure of about 10$^{-4}$ torr or less. Where a uniform dispersion of catalyst in amorphous carbon or amorphous carbon in catalyst is desired, the carbon precursor and the catalyst are substantially simultaneously vaporized at predetermined rates, directed via an aperture or nozzle, and condensed onto the substrate in a vacuum. Where a graded dispersion of catalyst in amorphous carbon is desired, the catalyst is deposited at a higher rate earlier or later in the coating process, depending upon the desired location of the higher concentration of catalyst.

The temperature in the vacuum may vary; however, the temperature is low enough not to damage the substrate material. Preferably, the temperature is less than about 100° C. (212° F.). The condensation is continued until a preferred thickness of carbon precursor/catalyst condensation is achieved.

Preferably at the same time, the component should be bombarded or irradiated, either in a continuous or interrupted fashion, with an energetic beam of ions. Preferred ions are nitrogen, argon, hydrogen, methane, helium, or neon, preferably argon, having an energy in the range of from about 500 eV to about 10 keV, preferably about 2 keV.

The energy of bombardment must be sufficient to ionize the constituent molecules in the carbon precursor film, and to rupture any C—H bonds present in the carbon precursor, thereby releasing the hydrogen into the surrounding vacuum to be pumped away. The energy dissipated by the energetic ion bombardment during ion beam assisted deposition is in the form of inelastic electronic excitations equivalent to at least about 100 eV for each carbon atom within the deposited coating. This energy dissipation strongly enhances adhesion of the DLC coating by rupturing and subsequently reforming interatomic bonds across the interfaces.

The ratio of ions in the beam per atoms of carbon precursor and catalyst at the surface being bombarded is defined as the "ion arrival ratio." The process should be carried out at an ion arrival ratio of about 1:10, or 1 ion per 10 atoms of carbon precursor and catalyst at the surface of the substrate. The ion bombardment is continued until an electrocatalyst coating is formed having a thickness in the range of from about 5 Angstroms to about 1 micron, preferably about 100 Angstroms. Where the catalyst is uniformly dispersed in an amorphous carbon coating, a suitable catalyst loading is in the range of from about 0.01 to about 0.1 mg/cm$^2$. Where a gradation of catalyst in amorphous carbon or amorphous carbon in catalyst is desired, the concentration of catalyst portions of the coating may contain no catalyst or may contain up to 100 atomic % catalyst. Preferred catalyst gradients range from about 15 atomic % at to about 75 atomic %. Sputter Auger Electron Spectroscopy (AES) is an effective method to determine the Pt distribution and total Pt loading of the electrode.

The amount of time required to form the coating will vary with the intensity of the ion beam. At an ion-to-atom ratio of about 1 to 10 and an energy of about 2 keV, about 10–20 minutes of ion bombardment is sufficient to obtain a coating of about 100 Angstroms thickness. This assumes an incident current density of about 0.05 mA per cm$^2$, which is a practicable value. Should the current density reach 0.1 mA per cm$^2$ at an ion bombardment energy of 10 keV, this would correspond to an incident power density of 1 W per cm$^2$, which would be enough to cause rapid heating of the substrate to an excessive level. Where the substrate is a heat sensitive membrane, the membrane preferably is cooled during coating, preferably by passing the membrane over the surface of a water-cooled metal platen, fabricated from copper or aluminum, in order to maintain a surface temperature below about 100° C. The thickness of the coating may be monitored by standard methods, e.g., using the frequency change of a quartz crystal oscillator or by weighing a known area of substrate material before and after coating.

Individual membranes or electrodes may be prepared, or the process may be scaled up for production purposes. In the laboratory, the PEM is mounted on the surface of an aluminum cylinder and rotated through the ion and coating flux. With this setup, water cooling is no longer necessary because of the sufficiently large thermal mass of the cylinder combined with the fact that the membrane is no longer continuously exposed to the ion beam and coating flux. This fixture appears to hold promise from a scale-up perspective as large areas of membrane material can be rolled up on a drum and coated in a reel-to-reel process. Preferably, a scaled up arrangement will be a reel-to-reel arrangement in vacuo. The coating technique described herein is adaptable for use with conventional "web coating" technologies.

Upon incorporation into a fuel cell and when supplied with hydrogen gas under suitable flow conditions, the electrocatalytic coating of the invention exhibits an open circuit voltage of at least about 0.8V, preferably about 1V. The term "open circuit voltage" or "open cell voltage" is defined as the spontaneous potential or voltage present in a fuel cell when no current is allowed to flow. This potential is known as the cell equilibrium potential and its theoretical value can be derived from thermodynamics using the Newest relationship:

$$E = E° + \frac{RT}{nF}\ln\left[\frac{\prod (\text{reactant activity})}{\prod (\text{product activity})}\right] \quad [1]$$

where n is the number of electrons participating in the reaction, F is the Faraday's constant (96,439 coulombs/g-mole electron), R is the universal gas constant, T is the cell temperature and E° is the reversible standard cell potential for the reaction, which is directly related to the maximum electrical work $W_e$ obtainable in a fuel cell operating at constant temperature and pressure and is thermodynamically given by the change in Gibbs free energy ($\Delta G$) of the electrochemical reaction.

$$W_e = \Delta G° = -nFE° \quad [2]$$

For the overall cell reaction, the open circuit potential increases with an increase in the activity of reactants and a decrease in the activity of products. Changes in cell temperature and pressure also influence the reversible cell potential. Practically, the open circuit voltage is the maximum voltage attainable during a fuel cell polarization or 1V curve, and corresponds to the cell potential at which the drawn net cell current is zero.

For example, after appropriate equilibration time, a PEM fuel cell will observe an open circuit voltage in the range of from about 0.8V and about 1V versus a reference standard hydrogen electrode when operating: (a) at a temperature in the range of from about 50° C. to about 130° C.; (b) with hydrogen and air as reactants; (c) humidified at a temperature in the range of from about 50° C. to about 140° C.; (d) with relative humidities in the range of from about 0 to about 100%; (e) with pressures in the range of from about 0 to about 100 psig; and, (f) with flows large enough to assure complete irrigation of the electrocatalyst phase throughout the electrode.

The invention will be better understood with reference to the following examples, which are intended to be illustrative only and should not be construed as limiting the present invention.

EXAMPLE I

Special sample fixtures were developed to allow for the coating of fluoroionomer membranes, carbon cloth, and carbon paper electrodes over areas as large as 300 cm². In order to maintain good heat transfer of the substrate material to the support fixture, samples were mounted over the surface of an aluminum cylinder and rotated through the ion and coating flux. With this setup, water cooling was not necessary because of the sufficiently large thermal mass of the cylinder combined with the fact the materials were no longer continuously exposed to the ion beam and coating flux. This fixture holds promise from a scale-up perspective as large areas of membrane material could be rolled up on a drum and coated in a reel-to-reel process analogous to conventional web-coating methods. Carbon cloth electrode materials up to 250 cm² were also coated using a planetary gear arrangement. The samples were asynchronously rotated through the coating flux to ensure uniform deposition of the Pt over the entire electrode surface.

EXAMPLE II

A series of fluoroionomer membrane and carbon cloth materials were coated and assembled into membrane electrode assemblies for use in a custom built test cell. A number of samples initially were coated using the preferred method with Pt and C via simultaneous electron beam plasma vapor deposition (EB-PVD) of Pt and IBAD of carbon using different Pt concentrations, deposition rates, and electrode layer thickness. Using polyphenyl ether as an organic carbon precursor, Pt-C coatings, 10 Angstroms to 1 $\mu$m thick, with Pt loadings in the range of 0.001–0.10 mg/cm² were deposited under 2 keV Ar$^+$ ion bombardment onto fluoroionomer membrane material, as well as samples of carbon cloth. Efforts also were made to vary the Pt concentration in a controllable manner throughout the film and, in particular, to produce a high concentration of Pt at the membrane electrode interface and the surface of the carbon cloth electrode. The electrical resistivity of these coatings measured on glass witness samples was determined to be in the range 0.02–0.10 ohm-cm.

EXAMPLE III

Initial performance analysis of Pt-C coated membrane material was undertaken using a custom-built test cell. The simple set-up consisted of two 6.9 cm stainless steel flanges as collector plates with single air/hydrogen inlets and pairs of 100-mesh stainless steel screens mounted on each side of the MEA to provide a degree of gas diffusion. The cell active area was approximately 64 cm² and the same electrode material was used for both the anode and cathode. Membranes were boiled in dionized water for at least 30 minutes prior to each test and compressed between the electrode materials with a mechanical pressure of roughly 300 psi. The system was pressurized with humidified hydrogen and compressed air at 14 psig, and current-voltage tests conducted at ambient temperature, with a flow rate of 0.5 liters per minute, were measured at each outlet.

Table 1 is a representative list of coated membrane and electrode materials examined using this simple cell. Coated electrode materials were tested in conjunction with untreated 50 $\mu$m thick fluoroionomer membrane material. While better performance was anticipated with a 10 or 20 $\mu$m membrane, more consistent results were achieved with the test cell using the thicker material.

| Sample | Material | Deposition Method | Pt Loading (mg/cm²) |
|---|---|---|---|
| A | 20 $\mu$m fluoroionomeric membrane | IBAD Pt-C | 0.10 |
| B | 0.35 mm wet proofed C-paper | IBAD-Pt-C | 0.10 |
| C | 0.30 mm wet proofed C-paper | IBAD-Pt-C | 0.10 |

While the initial overall performance and fuel cell efficiency was less than current performance benchmarks due in part to non-optimized flow design, initial open circuit voltages were on the order of 0.7–0.8V. Of particular note is the ability of this method to produce electrocatalytic coatings on a wide variety of fuel cell materials which have ultralow catalyst loadings (<=0.1 mg/cm²) which can be deposited over large areas (>250 cm²) with a high degree of uniformity (+/−10%).

Persons of skill in the art will appreciate that many modifications may be made to the embodiments described herein without departing from the spirit of the present invention. Accordingly, the embodiments described herein are illustrative only and are not intended to limit the scope of the present invention.

I claim:

1. An electrode comprising:
   a film having a thickness and comprising amorphous carbon comprising a dispersion comprising a load of a noble metal electrocatalyst;
   wherein said thickness and said load are effective to produce a fuel cell open circuit voltage of about 0.8V or greater.

2. The electrode of claim 1 wherein said load is about 0.01 mg/cm$^2$ or less.

3. The electrode of claim 1 wherein said dispersion is uniform.

4. A membrane electrode assembly comprising:
   a membrane adapted to transport ions and having a first surface and a second surface;
   a first electrode disposed on said first surface;
   a second electrode disposed on said second surface;
   wherein said first electrode and said second electrode comprise amorphous carbon comprising
      a dispersion comprising a load of a noble metal electrocatalyst effective to produce a fuel cell open circuit voltage of about 0.8V or greater.

5. The membrane electrode assembly of claim 4
   wherein said membrane comprises a composite of polytetrafluoroethylene
      comprising impregnated ion exchange media, said composite comprising
      a thickness of about 1 $\mu$m; and
   wherein said electrocatalyst comprises platinum.

6. A membrane electrode assembly comprising:
   a membrane adapted to transport ions and having a first surface and a second surface;
   a first electrode disposed on said first surface; and
   a second electrode disposed on said second surface;
   wherein said first and second electrodes comprise amorphous carbon comprising a dispersion
      comprising a load of a noble metal electrocatalyst effective to produce a fuel cell open circuit voltage of about 0.8V or greater.

7. The membrane electrode assembly of claim 6
   wherein said membrane comprises a composite of polytetrafluoroethylene
      comprising impregnated ion exchange media, said composite comprising
      a thickness of about 1 $\mu$m; and
   wherein said electrocatalyst comprises platinum.

* * * * *